United States Patent [19]

Hsu et al.

[11] Patent Number: 4,716,451

[45] Date of Patent: Dec. 29, 1987

[54] SEMICONDUCTOR DEVICE WITH INTERNAL GETTERING REGION

[75] Inventors: Sheng T. Hsu, Lawrenceville; Doris W. Flatley, Belle Mead, both of N.J.

[73] Assignee: RCA Corporation, Princeton, N.J.

[21] Appl. No.: 448,724

[22] Filed: Dec. 10, 1982

[51] Int. Cl.[4] .......................................... H01L 27/04
[52] U.S. Cl. ............................... 357/42; 357/64; 357/91
[58] Field of Search ............... 357/42, 20, 23 C, 29, 357/24, 64

[56] References Cited

U.S. PATENT DOCUMENTS

| | | | |
|---|---|---|---|
| 3,457,632 | 7/1969 | Dolan et al. | 29/578 |
| 3,465,209 | 9/1969 | Denning et al. | 317/234 |
| 3,556,879 | 1/1971 | Mayer | 148/191 |
| 3,838,440 | 9/1974 | McCaffrey et al. | 357/64 |
| 3,946,425 | 3/1976 | Shoji et al. | 357/64 |
| 4,053,335 | 10/1977 | Hu | 357/64 |
| 4,053,925 | 10/1977 | Burr et al. | 357/29 |
| 4,424,526 | 1/1984 | Dennard et al. | 357/29 |
| 4,435,895 | 3/1984 | Parrillo et al. | 357/42 |
| 4,454,523 | 6/1984 | Hill | 357/20 |

OTHER PUBLICATIONS

Wordeman et al., "A Buried N-Grid for Protection Against Radiation Induced Charge Collection in Electrostatic Circuits", *IEDM Tech. Digest*, 1981, pp. 40–43.
"Gettering Processes for Defect Control," J. R. Monkowski, Solid State Technology, Jul. 1981, pp. 44–51.

*Primary Examiner*—William D. Larkins
*Attorney, Agent, or Firm*—Henry I. Steckler; Fred Jacob; Allen LeRoy Limberg

[57] ABSTRACT

A semiconductor device includes a substrate of single crystalline silicon having the active regions of a semiconductor element, such as the source, drain, channel and gates, along one surface of the substrate, and a thin gettering region of a gettering material in the substrate. The gettering region is spaced from both surfaces of the substrate and is adjacent the active regions of the semiconductor element so as to getter contaminants in the substrate from the area of the substrate containing the semiconductor element.

7 Claims, 8 Drawing Figures

SEMICONDUCTOR DEVICE WITH INTERNAL GETTERING REGION

BACKGROUND OF THE INVENTION

The present invention relates to a semiconductor device having an internal gettering region and the method of making the same. More particularly, the present invention relates to a semiconductor device having at least one metal oxide semiconductor (MOS) transistor therein with a thin gettering region adjacent to but spaced from the active region of the transistor, and the method of making the same.

Wafers of single crystalline silicon used in making semiconductor devices generally contain contaminants, such as metal ions, which can adversely affect the electrical characteristics of the semiconductor device made in the wafer. In particular, these contaminants adversely affect the characteristics of MOS transistors formed in the wafer. Various techniques have been developed to remove these contaminants from at least the area where the active regions of the semiconductor device are formed. One technique used in making devices, including MOS transistors, is to grow a silicon oxide layer on the surface of the wafer in an atmosphere containing hydrogen chloride as described in U.S. Pat. No. 3,556,879, T. A. Major, issued Jan. 19, 1971, entitled METHOD OF TREATING SEMICONDUCTOR DEVICES, to remove the metal ions from the surface region of the wafer. Another technique is to coat the completed device with a protective coating containing a gettering material such as a glass containing phosphorus, as described in U.S. Pat. No. 3,465,209, T. R. Denning et al., issued Sept. 2, 1969, entitled SEMICONDUCTOR DEVICES AND METHODS OF MANUFACTURE THEREOF. A third technique is to embed a gettering material in and across the back surface of the wafer. A problem with the first two techniques is that they merely getter the surface of the wafer and do not provide much gettering for the internal portions of the wafer. Although the third technique does getter the internal portions of the wafer, this technique requires a very high concentration of the gettering material in order to getter completely across the thickness of the wafer to the active regions.

SUMMARY OF THE INVENTION

A semiconductor device includes a substrate of a single crystalline semiconductor material having opposed surfaces. The active regions of at least one semiconductor element are in the substrate adjacent one of said surfaces. A thin gettering region containing ions of a gettering material is within the substrate spaced from both said surfaces and extends across and adjacent to the active regions of at least one of the semiconductor elements.

DETAILED DESCRIPTION OF PREFERRED EMBODIMENT

Figure 1:
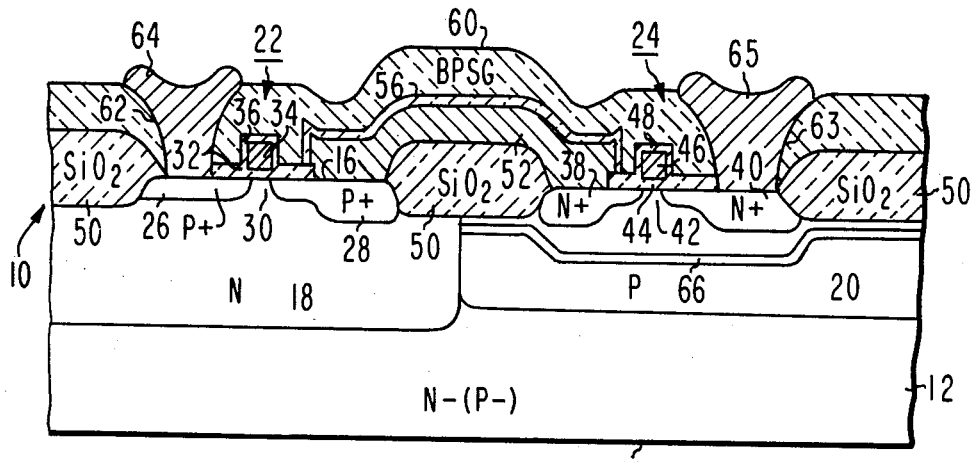
FIG. 1 is a sectional view of one form of a semiconductor device which incorporates the present invention.

Referring to FIG. 1, a semiconductor device which is a complementary MOS (CMOS) transistor device which includes the present invention is generally designated as 10. The CMOS semiconductor device 10 includes a substrate 12 of a single crystalline silicon having opposed major surfaces 14 and 16. The substrate 12 can be of either N- type or P- type conductivity having a resistivity of at least 5 ohm-centimeters. In the substrate 12 and extending from the major surface 16 is a well 18 of N type conductivity adjacent a well 20 of P type conductivity. In the N well 18 is a P type MOS transistor element 22 and in the P well 20 is an N type MOS transistor element 24. The P type MOS transistor element 22 includes spaced, source and drain regions 26 and 28 of P+ type conductivity extending into the N well 18 from the surface 16, providing a channel 30 therebetween. A thin gate oxide layer 32 of silicon dioxide is on the surface 16 over the channel 30 and over adjacent portions of the source and drain regions 26 and 28. A gate 34 of a conductive material, such as doped polycrystalline silicon, is on the gate oxide layer 32 over the channel region 30. The gate 34 is coated with a protective layer 36 of silicon dioxide.

The N type MOS transistor element 24 includes a pair of spaced drain and source regions 38 and 40 of N+ type conductivity extending into the P well 20 from the surface 16, forming a channel region 42 therebetween. A thin gate oxide layer 44 of silicon dioxide is on the surface 16 over the channel region 42 and over adjacent portions of the drain and source regions 38 and 40. A gate 46 of a conductive material, such as doped polycrystalline silicon is on the gate oxide layer 44 over the channel region 42. The gate 46 is covered by a protective coating 48 of silicon dioxide.

A field oxide layer 50 of silicon dioxide is along the portions of the surface 16 which do not include the active regions, i.e., sources, drains and gates, of the MOS transistor elements 22 and 24. An interconnect strip 52 of a conductive material, such as doped polycrystalline silicon, extends from the drain 28 of the P type MOS transistor element 22 to the drain 38 of the N type MOS transistor element 24 over the portion of the field oxide 50 therebetween. The interconnect strip 52 contacts both the regions 28 and 38 to electrically connect the drain 28 of the P type MOS transistor element 22 to the drain 38 of the N type MOS transistor element 24. The interconnect strip 52 is coated with a thin protective layer 56 of silicon oxide. A thick layer 60 of an insulating material, such as a boron, phosphorus, silicon glass, is over the entire device 10. The insulating layer 60 has openings 62 and 63 therethrough to the source 26 of the P type MOS transistor element 22 and sources 40 of the N type MOS transistor element 24. Contacts 64 and 65 of an electrically conductive material, such as aluminum, fill the openings 62 and 63 and engage the sources 26 and 40 to make electrical contact thereto.

Figure 8:
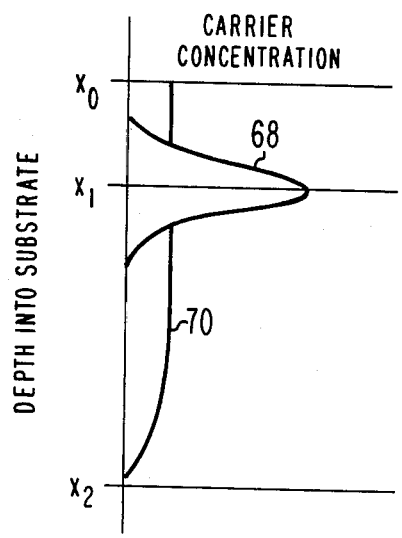
FIG. 8 is a graph showing the relation of the carrier concentration of the gettering region to that of the remaining portion of the semiconductor device.

The P well 20 contains a thin (in the order of 0.2 to 0.5 microns thick) gettering region 66 which extends completely across the P well 20 spaced from both of the surfaces 14 and 16 of the substrate 12. The gettering region 66 extends adjacent to but spaced from the active regions of the N type MOS transistor element 24. The gettering region 66 contains a gettering material which will getter metal ions. For a gettering region in a P well the preferred gettering material is boron ions, since they will not only getter the metal contaminants but, as will be explained, can be readily formed in the P well. As shown in FIG. 8, the gettering region 66 contains a concentration of boron ions at least $10^{19}$ ions per cm$^2$, much higher than that contained in the rest of the P well 20. In FIG. 8, $X_0$ is the surface 16, $X_1$ is the depth of the gettering region 66, and $X_2$ is the position of the bottom of the P well 20. Line 68 indicates the concentration of the boron ions at the gettering region 66 and line 70 indicates the concentration of boron ions in the P well at both sides of the gettering region 66. Also, the gettering region 66 should not be completely annealed so as to provide stresses in the material of the gettering region 66 which will attract the contaminants to be gettered. The gettering region 66 being within the substrate 12 will getter the metal contaminants which are within the substrate 12 and not just those which are along the surface of the substrate. However, by having the gettering region 66 adjacent the active regions of the MOS transistor element, the gettering region 66 requires a lower concentration of the gettering material than is required by a gettering region along the back surface 14 of the substrate 12.

Figure 2:
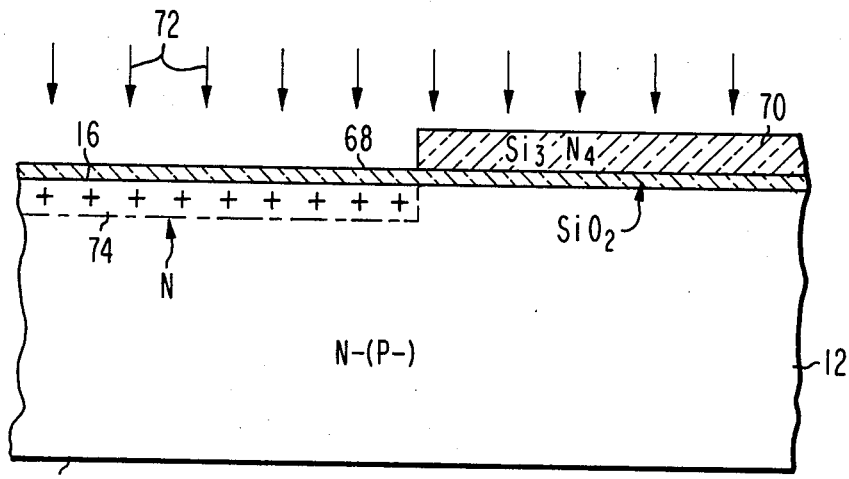
FIGS. 2–7 are sectional views showing the steps of making the semiconductor device shown in FIG. 1.

To make the semiconductor device 10, the substrate 12 of the appropriate conductivity type and resistivity is coated on its surface 16 with a thin layer 68 of silicon dioxide as shown in FIG. 2. This is accomplished by first cleaning the surface 16 and then exposing it to steam at a temperature of about 800° C. to grow the silicon dioxide layer 68 on the surface 16. A layer 70 of silicon nitride is then deposited on the silicon dioxide layer 68. This is accomplished by exposing the silicon dioxide layer 68 to an atmosphere of silane and ammonia at a temperature of 800° C. to react the silane with the ammonia to form the silicon nitride which is deposited on the silicon dioxide layer 68. Using standard photolithographic techniques, a photoresist layer, not shown, is formed over the portion of the silicon nitride layer 70 which is over the area of the substrate 12 where the P well 20 is to be formed. The exposed portion of the silicon nitride layer 70 is then removed with a suitable etchant, preferably by plasma etching. The photoresist layer is then removed with a suitable stripper, preferably a plasma stripper. Phosphorus ions are then implanted into the substrate 12 as indicated by the arrows 72. The phosphorus ions will pass through the silicon dioxide layer 68 to form a pocket 74 of the phosphorus ions within the substrate 12 along the surface 16. However, the silicon nitride layer 70 will prevent the phosphorus ions from entering the portion of the substrate 12 where the P well 20 is to be formed.

Figure 3:
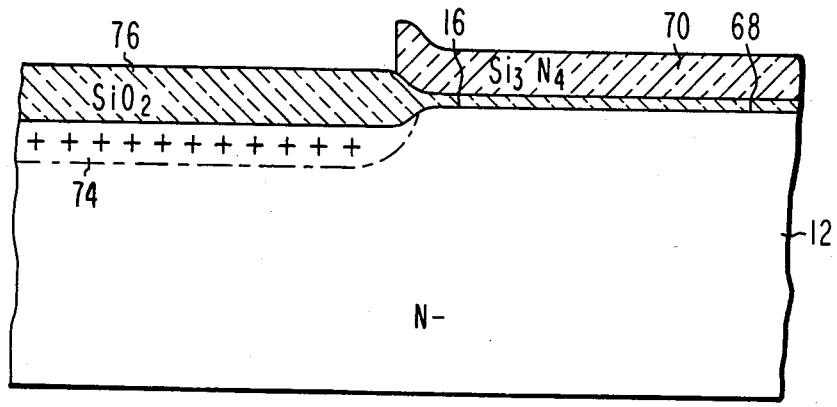
Figure 4:
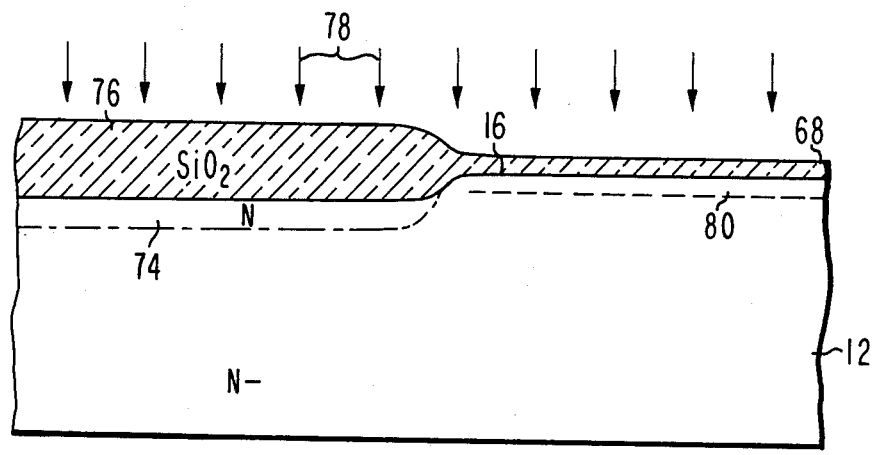
Figure 5:
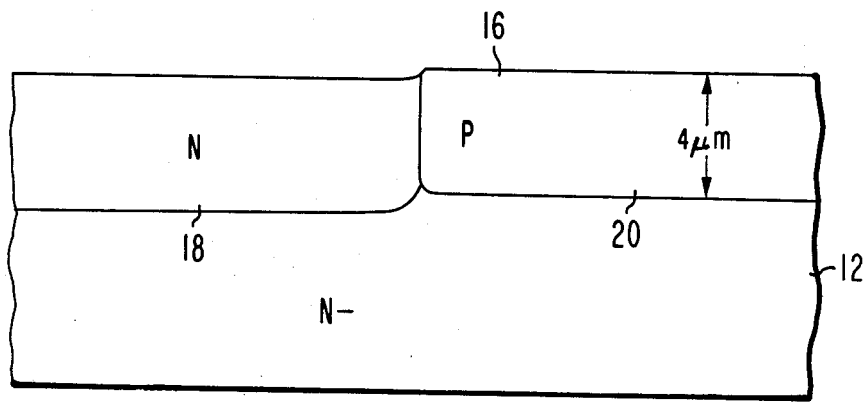

As shown in FIG. 3, the substrate 12 is then exposed to steam at about 1100° C. to form a thicker layer 76 of silicon dioxide over the pocket 74. The remaining portion of the silicon nitride layer 70 is then removed using a suitable etchant, preferably a plasma etchant, and as shown in FIG. 4, boron ions are implanted into the substrate 12 as indicated by the arrows 78. The boron atoms will pass through the thin layer 68 of silicon dioxide to form a pocket 80 of boron ions in the substrate 12 along the surface 16. However, the thick layer 76 of silicon dioxide will prevent the boron ions from entering the pocket 74 of phosphorous ions. The substrate 12 is then heated at a temperature of about 1200° C. in an atmosphere of 80% nitrogen, 20% oxygen and 0.5% hydrogen chloride to drive the phosphorus ions and boron ions in the pockets 74 and 80, respectively, deeper into the substrate 12 to form the N well 18 and P well 20 as shown in FIG. 5. The oxide layers 68 and 76 are then removed with a suitable etchant, such as buffered HF.

Figure 6:
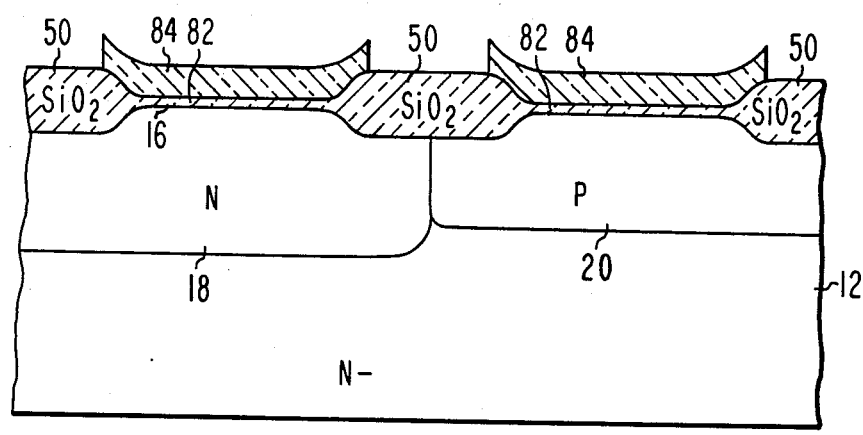

As shown in FIG. 6, a thin layer 82 of silicon dioxide is then grown on the surface 16 by exposing the substrate 12 to steam at about 800° C. A silicon nitride layer 84 is then deposited over the silicon oxide layer 82 in the manner as previously described. Using standard photolithographic techniques, a photoresist layer is then formed on the silicon nitride layer 84 over the areas of the substrate 12 where the P type and N type MOS transistor elements 22 and 24 are to be formed. The exposed portions of the silicon nitride layer 84 are removed using a suitable etchant, such as by plasma etching. The exposed areas of the silicon dioxide layer 82 are then subjected to steam and hydrogen chloride at 1100° C. to form the field oxide layer 50. The silicon nitride layer 84 is then removed, such as by plasma etching, and the thin oxide layer 82 is removed, such as with buffered HF.

Figure 7:
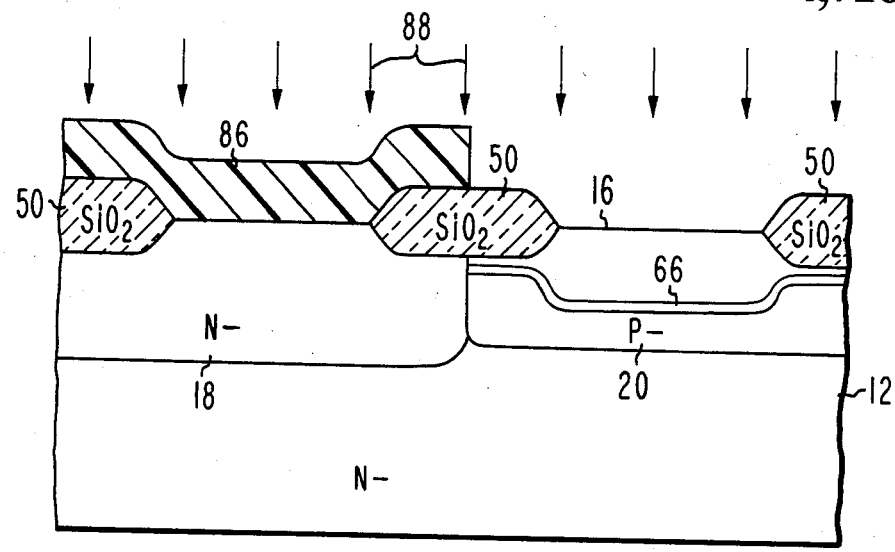

As shown in FIG. 7, a layer 86 of photoresist is formed over the N well 18 using standard photolithographic techniques. Boron atoms are then implanted in the substrate 12 at a high energy as indicated by the arrows 88. The dose of boron ions is about $2 \times 10^{12}$ cm$^{-2}$ and is implanted at an energy of 150 KeV. The boron atoms will enter the P well 20 to form the thin gettering region 66 in the P well 20. The photoresist layer 86 will prevent the boron atoms from entering the N well 18. The device is not intentionally annealed after this implantation step.

After removing the photoresist layer 86, the MOS transistor elements 22 and 24 are formed in the N well 18 and P well 20 by any method well known in the art. For example, the gate oxide layers 32 and 44 are grown on the exposed portions of the surface 16 in the N well 18 and P well 20, respectively, by exposing the surfaces to steam at 800° C. The gates 34 and 46 are then formed on the gate oxide layers 32 and 44, respectively, by depositing a layer of polycrystalline silicon over the gate oxide layers 32 and 44 and defining the gates 34 and 44 using standard photolithographic techniques. After providing the protective oxide coatings 36 and 48 over the gates 34 and 44, the source and drain regions 26 and 28 of the P type MOS transistor element 22 are formed by ion implantation of boron into the N well 18, and the source and drain regions 38 and 40 of the N type MOS transistor element 24 are formed by ion implantation of phosphorus into the P well 20. The gates 34 and 46 serve as shields during the ion implantations to form the channel regions 30 and 42. Openings are then etched through the gate oxide layers 32 and 44 over the drain 28 of the P type MOS transistor element 22 and the drain region 38 of the N type MOS element 24. The interconnect 52 is then formed by depositing a layer of polycrystalline silicon and defining the interconnect 52 using standard photolithographic techniques. After providing the oxide protective layer 56 over the interconnect 52, the glass layer 60 is coated over the entire device. The openings 62 and 63 are then formed through the glass layer 60 to the source 26 of the P type MOS element 22 and the source 46 of the N type MOS transistor element 24, and the metal contacts 64 and 65 are deposited in the openings 62 and 63 to complete the device.

During the formation of the transistor elements 22 and 24 after the gettering region 66 is formed, the heating of the device required by some of the steps may anneal the gettering region to some extent. However, the steps should be controlled so that the gettering region 66 is not completely annealed and will therefore function to getter the contaminants which are in the portions of the P well 20 adjacent the gettering region 66.

We claim:

1. A semiconductor device comprising:
   a substrate of single crystalline silicon having opposed surfaces,
   the active region of at least one semiconductor element on said substrate adjacent one of said surfaces, and
   means for gettering including a thin gettering region of a substantially unannealed gettering material in said substrate spaced from both said surfaces and extending adjacent but spaced from the active regions of at least one of said semiconductor elements.

2. A semiconductor device in accordance with claim 1 in which the gettering region ions are of the same conductivity type but in a higher concentration than is contained in the surrounding portions of the substrate.

3. A semiconductor device in accordance with cliam 2 in which the portion of the substrate across which the gettering region extends is of P type conductivity and the gettering material is ions of boron.

4. A semiconductor device comprising:
   a substrate of single crystalline silicon having opposed surfaces,
   a pair of adjacent wells in said substrate along one of said surfaces, one of said wells being of one conductivity type and the other of said wells being of the opposite conductivity type,
   the active region of at least one semiconductor element being along said surface at one of said wells, and
   means for gettering including a thin gettering region of a substantially unannealed gettering material extending across one of said wells spaced from both of said surfaces and adjacent to but spaced from the active regions in said well.

5. A semiconductor device in accordance with claim 4 in which the gettering region contains ions of the same conductivity type but in higher concentration than the ions in the one well.

6. A semiconductor device in accordance with claim 5 in which the one well is of P type conductivity and the gettering material is ions of boron.

7. A semiconductor device in accordance with claim 6 in which the one well includes at least one MOS transistor element and the semiconductor element therein.

* * * * *